United States Patent
Kim et al.

(10) Patent No.: US 11,563,202 B2
(45) Date of Patent: Jan. 24, 2023

(54) USING A LASER TO ADJUST AT LEAST ONE OF A STAGE AND A HEAD UNIT DURING MANUFACTURING OF A DISPLAY DEVICE

(71) Applicant: SAMSUNG DISPLAY CO., LTD., Yongin-si (KR)

(72) Inventors: Jongsung Kim, Yongin-si (KR); Honggi Min, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 219 days.

(21) Appl. No.: 16/929,597

(22) Filed: Jul. 15, 2020

(65) Prior Publication Data
US 2021/0210734 A1   Jul. 8, 2021

(30) Foreign Application Priority Data
Jan. 7, 2020   (KR) .......................... 10-2020-0002143

(51) Int. Cl.
| | |
|---|---|
| *H01L 21/00* | (2006.01) |
| *H01L 51/56* | (2006.01) |
| *H01L 27/32* | (2006.01) |
| *B05B 12/08* | (2006.01) |
| *H01L 51/00* | (2006.01) |
| *B05B 12/00* | (2018.01) |

(52) U.S. Cl.
CPC ............ *H01L 51/56* (2013.01); *B05B 12/004* (2013.01); *B05B 12/082* (2013.01); *H01L 27/3244* (2013.01); *H01L 51/0003* (2013.01); *H01L 51/0012* (2013.01)

(58) Field of Classification Search
CPC ...................................................... H01L 51/56
See application file for complete search history.

(56) References Cited

U.S. PATENT DOCUMENTS

| | | | |
|---|---|---|---|
| 6,850,324 B1 * | 2/2005 | De Metz | G01N 15/0211 356/336 |
| 7,804,604 B2 * | 9/2010 | Teichman | B05B 12/004 356/616 |
| 7,909,426 B2 | 3/2011 | Kim | |
| 8,366,232 B2 * | 2/2013 | Sakai | B41J 29/38 347/19 |

(Continued)

FOREIGN PATENT DOCUMENTS

| | | |
|---|---|---|
| JP | 2010-240503 | 10/2010 |
| JP | 5321090 | 7/2013 |

(Continued)

*Primary Examiner* — Caleb E Henry
(74) *Attorney, Agent, or Firm* — F. Chau & Associates, LLC

(57) ABSTRACT

An apparatus for manufacturing a display device includes: a stage configured to hold a substrate; a movement unit configured to move relative to the stage; a head unit arranged on the movement unit and including a nozzle for discharging a liquid droplet onto the substrate; and a sensor unit configured to emit a laser to irradiate the liquid droplet falling from the head unit to the substrate to sense a portion of a planar shape of the liquid droplet. The apparatus is configured to control the movement unit or the head unit based on the sensed portion of the planar shape.

17 Claims, 12 Drawing Sheets

(56) References Cited

U.S. PATENT DOCUMENTS

| | | | | |
|---|---|---|---|---|
| 8,440,253 | B2* | 5/2013 | Hanaoka | G01B 11/00 |
| | | | | 427/64 |
| 8,765,212 | B2* | 7/2014 | Abernathy | H05K 3/0008 |
| | | | | 427/427.2 |
| 9,964,495 | B1* | 5/2018 | Marshall | G06T 7/20 |
| 2002/0159070 | A1* | 10/2002 | Maeda | G01P 5/18 |
| | | | | 356/496 |
| 2005/0122363 | A1* | 6/2005 | Koyama | B41J 2/0456 |
| | | | | 347/19 |
| 2018/0008995 | A1* | 1/2018 | Baker | B05B 12/12 |
| 2019/0051903 | A1* | 2/2019 | Manabe | C01B 32/18 |
| 2019/0219491 | A1* | 7/2019 | Sivathanu | G01N 15/0211 |
| 2021/0220857 | A1* | 7/2021 | Baker | B41J 2/04593 |
| 2021/0296375 | A1* | 9/2021 | Han | B41J 2/0456 |

FOREIGN PATENT DOCUMENTS

| | | |
|---|---|---|
| JP | 2017-161269 | 9/2017 |
| JP | 6245726 | 11/2017 |
| KR | 10-0901075 | 5/2009 |
| KR | 10-1657485 | 9/2016 |

\* cited by examiner

USING A LASER TO ADJUST AT LEAST ONE OF A STAGE AND A HEAD UNIT DURING MANUFACTURING OF A DISPLAY DEVICE

CROSS-REFERENCE TO RELATED APPLICATION

This U.S. non-provisional patent application claims the benefit of priority under 35 U.S.C. § 119 to Korean Patent Application No. 10-2020-0002143, filed on Jan. 7, 2020, in the Korean Intellectual Property Office, the disclosure of which is incorporated by reference in its entirety herein.

BACKGROUND

1. Technical Field

One or more embodiments relate to an apparatus and a method, and more particularly, to an apparatus for manufacturing a display device and a method of manufacturing the display device.

2. Discussion of Related Art

Mobile devices are widely used and typically include any handheld computer device. Examples of mobile devices include smart phones and tablet personal computers (PC).

Mobile devices include a display device to provide a user with visual information such as an image. When components driving the display device are miniaturized, the size of the display device can be greatly increased.

SUMMARY

One or more embodiments of the disclosure include an apparatus for manufacturing a display device and a method of manufacturing the display device.

According to an exemplary embodiment of the disclosure, an apparatus for manufacturing a display device includes a stage configured to hold a substrate, a movement unit configured to move relative to the stage, a head unit arranged on the movement unit and including a nozzle for discharging a liquid droplet to the substrate, and a sensor unit configured to emit a laser to irradiate the liquid droplet falling between from the head unit to the substrate and to sense a portion of a planar shape of the liquid droplet.

The sensor unit may direct the laser to one region of a plane perpendicular to a falling direction of the liquid droplet.

The sensor unit may configure the laser to have a certain shape from among a plurality of available line shapes.

In an exemplary embodiment, the laser is reflected by the liquid droplet arranged in a region apart from the sensor unit by a first distance to generate reflected light and the sensor unit determines the portion of the planar shape using the reflected light.

In an exemplary embodiment, the sensor unit includes a plurality of sensors emitting the laser to the outside, and the plurality of sensors are arranged in a line.

The sensor unit may be arranged on the movement unit.

The sensor unit may include a sensor arranged on the movement unit, generating, and emitting the laser, and a reflector configured to bend a path of the laser, the reflector being apart from the sensor.

The sensor unit may emit the laser along a plane inclined with respect to a top surface of the substrate on which the liquid droplet falls down.

The liquid droplet may include an organic material.

A controller of the apparatus may control at least one of whether to operate the head unit, a falling speed of the liquid droplet, and an amount of the liquid droplet based on the planar shape of the liquid droplet sensed by the sensor unit.

A controller of the apparatus may synchronize an operation frequency of the head unit with an operation frequency of the laser.

A controller of the apparatus may calculate the planar shape of the liquid droplet and a planar center of the liquid droplet with respect to the sensor unit may be calculated based on a result sensed by the sensor unit.

A controller of the apparatus may calculate a location of the liquid droplet falling down to the substrate based on the planar center of the liquid droplet.

The head unit may include a plurality of heads, and a relative location between respective heads may be determined based on a center of the planar shape of the liquid droplet falling down from each head.

The apparatus is configured to control the movement unit or the head unit based on the sensed portion of the planar shape.

According to an exemplary embodiment, a method of manufacturing a display device includes discharging a material from a head unit to drop a liquid droplet of the material onto a substrate, emitting a laser along a certain plane to irradiate the liquid droplet while the liquid droplet falls down to the substrate, and measuring a portion of a planar shape of the liquid droplet using light of the laser reflected from the falling liquid droplet.

The emitting may emit at least two lasers along the certain plane through which the liquid droplet passes.

The at least two lasers may be parallel to each other.

The certain plane may be parallel to a top surface of the substrate to which the liquid droplet falls down.

The certain plane may be inclined with respect to a top surface of the substrate to which the liquid droplet falls down.

The liquid droplet may pass through the laser at a point that is apart by a predetermined distance from a point from which the laser is emitted.

The liquid droplet may include an organic material.

The method may further include determining a planar location of the measured liquid droplet, determining whether the discharging is to be stopped based on the planar location of the liquid droplet, and controlling the head unit to stop the discharging when it is determined that the discharging is to be stopped.

The method may further include calculating a planar size of the liquid droplet from a result of the measuring and the head unit to adjust a discharge amount of the liquid droplet based on the planar size of the liquid droplet.

The method may further include controlling the head unit based on the measured portion of the planar shape.

According to an exemplary embodiment of the disclosure, a method of manufacturing a display device includes arranging a substrate on a stage, a sensor emitting a laser to irradiate the liquid droplet falling from the head unit onto the substrate, the sensor sensing light of the laser that is reflected from the liquid droplet, calculating a portion of a planar shape of the liquid droplet by sensing the reflected light, and adjusting relative locations of the stage and the head unit to adjust relative locations of the substrate and the head unit, based on the calculated portion.

The method may further include synchronizing an operation frequency (e.g., a discharge frequency) of the head unit with an operation frequency of the sensor.

A path of the laser emitted from the sensor may be variable.

The sensor may move relative to the stage.

The emitting by the sensor may including emitting at least two parallel lasers.

The at least two lasers may form a plane, and the plane formed by the at least two lasers may be parallel to a top surface of the substrate or be inclined with respect to the top surface of the substrate.

The method may further include controlling at least one of whether to operate the head unit, a falling speed of the liquid droplet, and an amount of the liquid droplet based on the planar shape of the liquid droplet sensed by the sensor.

These and/or other aspects will become apparent and more readily appreciated from the following description of the embodiments and the accompanying drawings.

These general and specific aspects may be implemented by using a system, a method, a computer program, or a combination of a certain system, method, and computer program.

BRIEF DESCRIPTION OF THE DRAWINGS

Exemplary embodiments of the disclosure will become more apparent from the following description taken in conjunction with the accompanying drawings, in which.

DETAILED DESCRIPTION OF THE EXEMPLARY EMBODIMENTS

Figure 1:
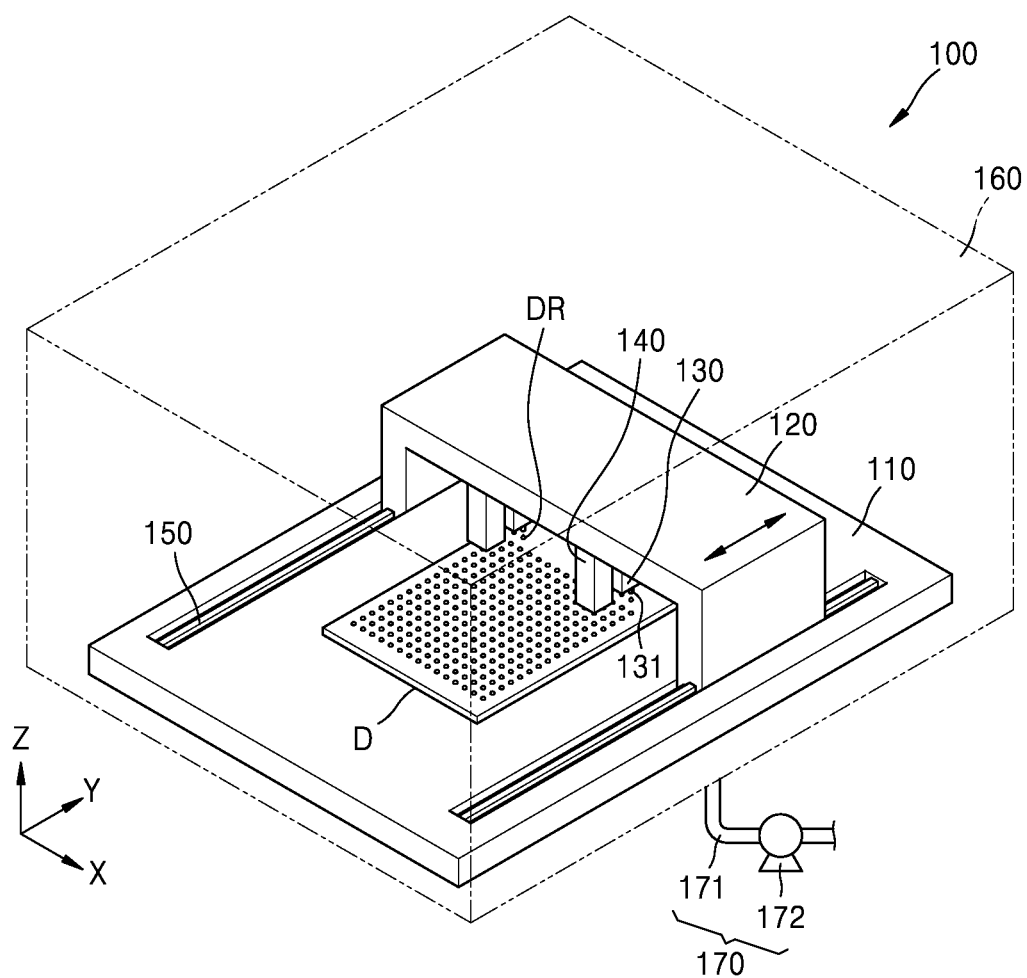
FIG. 1 is a perspective view of an apparatus for manufacturing a display device according to an exemplary embodiment of the inventive concept.

Reference will now be made in detail to exemplary embodiments of the disclosure, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, the present embodiments are described in detail with reference to the accompanying drawings. In the drawings, the same reference numerals are given to the same or corresponding elements, and repeated description thereof is omitted.

As used herein, the singular forms "a," "an," and "the" are intended to include the plural forms as well, unless the context clearly indicates otherwise.

It will be understood that when a layer, region, or component is referred to as being "formed on," another layer, region, or component, it can be directly or indirectly formed on the other layer, region, or component. That is, for example, intervening layers, regions, or components may be present.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 2:
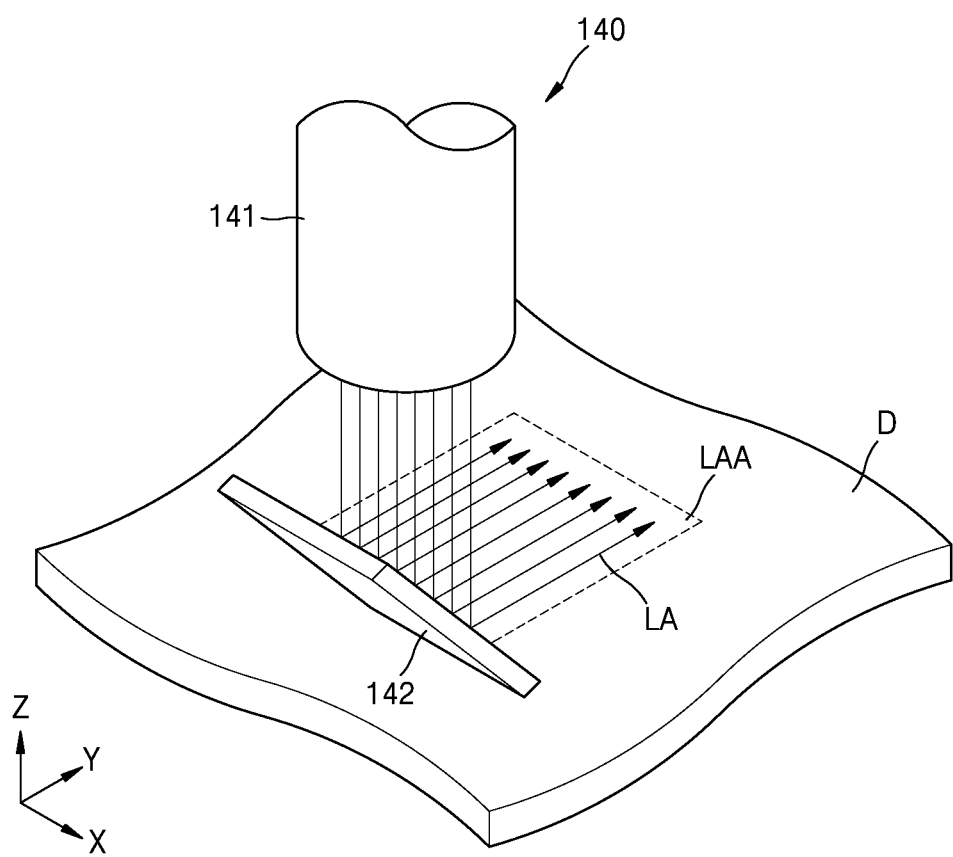
FIG. 2 is a perspective view of a sensor unit shown in FIG. 1 according to an exemplary embodiment of the inventive concept.
Figure 3:
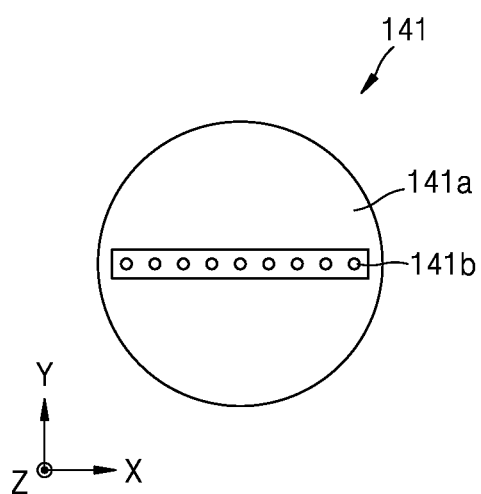
FIG. 3 is a backside view of a bottom surface of a laser generator shown in FIG. 2 according to an exemplary embodiment of the inventive concept.

FIG. 1 is a perspective view of an apparatus 100 for manufacturing a display device according to an exemplary embodiment of the inventive concept. FIG. 2 is a perspective view of a sensor unit shown in FIG. 1 according to an exemplary embodiment of the inventive concept. FIG. 3 is a backside view of a bottom surface of a laser generator shown in FIG. 2 according to an exemplary embodiment of the inventive concept.

Referring to FIGS. 1 to 3, the apparatus 100 for manufacturing a display device includes a stage 110, a movement unit 120, a head unit 130, and a sensor unit 140.

The stage 110 may be arranged on a display substrate D. In this case, the stage 110 may be formed in a plate shape and seated and fixed on the display substrate D. In an exemplary embodiment, a groove is present in the stage 110 such that at least a portion of the display substrate D is inserted into the groove. In an exemplary embodiment, a depression is presented in a surface of the stage 110 such that at least a portion of the display substrate D is inserted into the groove. In another exemplary embodiment, a vacuum hole is present in a surface of the stage 110, and the stage 110 includes a pump that absorbs a gas inside the vacuum hole in cooperation with the vacuum hole. In this case, when the pump operates, pressure inside the vacuum hole may reach almost a vacuum state and thus the display substrate D may be fixed to the stage 110. In another embodiment, the stage 110 may include an electrostatic chuck or an adhesive chuck attached to the display substrate D. In another embodiment, the stage 110 may include a protrusion that is arranged to be ascendable and descendable to fix the display substrate D by applying force on a top surface of the display substrate D, or include a clamp, etc. that grips a lateral surface of the display substrate D.

The movement unit 120 may be arranged to move relative to the stage 110. For example, the stage 110 may be stationary and the movement unit 120 may perform a linear motion in one direction of the stage 110. In another embodiment, the movement unit 120 is stationary and the stage 110 performs a reciprocating motion in one direction with respect to the movement unit 120. In another embodiment, both the stage 110 and the movement unit 120 may move independently.

In an embodiment illustrated in FIG. 1, a separate linear driver 150 is connected between the movement unit 120 and the stage 110. In an exemplary embodiment, the linear driver 150 includes a ball screw and a motor, the ball screw being connected to the movement unit 120, and the motor being connected to the ball screw and fixed to the stage 110. In an exemplary embodiment, the linear driver 150 includes a linear motor connecting the movement unit 120 to the stage 110. In another embodiment, the linear driver 150 includes a cylinder connecting the movement unit 120 to the stage 110. In this case, a linear motion guide may be arranged between the movement unit 120 and the stage 110 to reduce frictional force while the movement unit 120 moves relative to the stage 110. Hereinafter, for convenience of description, the case where the linear driver 150 includes a linear motor, the stage 110 is stationary, and the movement unit 120 performs a linear motion in one direction of the stage 110 is mainly described in detail. In an exemplary embodiment, the movement unit 120 has a gantry shape. In an exemplary embodiment, the movement unit 120 is a structure or bracket that includes a first part shaped as a rectangular cuboid, a second part shaped as a rectangular cuboid connected at a right angle to a first side of the first part and extending towards the stage 110, and a third part shaped as a rectangular cuboid connected at a right angle to a second side of the first part opposing the first side and also extending towards the stage 110. The first through third parts may be integrated to form a single part.

The head unit 130 (e.g., a head for discharging or spraying a certain material) and the sensor unit 140 (e.g., a sensor device) may be arranged on the movement unit 120. In an embodiment, the head unit 130 may be fixed to the movement unit 120 or arranged to be linearly movable. In another embodiment, the head unit 130 is connected to the sensor unit 140 and in the case where the sensor unit 140 performs a linear motion, the head unit 130 moves together with the sensor unit 140. Hereinafter, for convenience of description, the case where the head unit 130 is connected to the movement unit 120 and performs a linear motion with respect to the movement unit 120 is described in detail.

In the case where the head unit 130 is connected to the movement unit 120 to be linearly movable, a head driver (not shown) may be arranged between the head unit 130 and the movement unit 120. The head driver may be formed the same as or similar to the linear driver 150 described above. The head unit 130 may include at least one nozzle 131 through which a material is discharged. In an embodiment where a plurality of nozzles 131 are provided, the plurality of nozzles 131 may be spaced apart from each other. Hereinafter, for convenience of description, the case where the plurality of nozzles 131 are provided is mainly described in detail.

The nozzle 131 may discharge the material. For example, the nozzle 131 may discharge the material in a line in a direction perpendicular to a movement direction of the movement unit 120. For example, the nozzle 131 may discharge the material onto the display substrate D. The material may include an organic material. In this case, the organic material may form an intermediate layer (not shown) described below. In another embodiment, the organic material may form an organic layer of a thin-film encapsulation layer (not shown) described below.

The sensor unit 140 may be connected to the movement unit 120 or the head unit 130. In an embodiment where the sensor unit 140 is arranged on the movement unit 120, the sensor unit 140 may perform a linear motion along the movement unit 120. In this case, the sensor unit 140 may be connected to the head driver or a separate driver arranged on the movement unit 120. In this case, because the motion of the sensor unit 140 cooperates with the driving of the head unit 130, the sensor unit 140 and the head unit 130 may move together in the same direction and at the same velocity. In another embodiment, the sensor unit 140 is connected to the head unit 130 and moves together with the head unit 130. In another embodiment, as described above, the head unit 130 is connected to the sensor unit 140, and when the sensor unit 140 performs a linear motion, the head unit 130 performs a linear motion together with the sensor unit 140. Hereinafter, for convenience of description, the case where the head unit 130 is connected to the sensor unit 140, and one of the head unit 130 and the sensor unit 140 is connected to the movement unit 120 to be linearly movable is mainly described in detail.

In an exemplary embodiment, the sensor unit 140 emits a laser LA to irradiate a liquid droplet DR in a direction perpendicular to a direction (e.g. a −Z direction of FIG. 1) in which the liquid droplet DR falls down. In an exemplary embodiment, the sensor unit 140 includes a sensor 141 and a reflector 142.

In an exemplary embodiment, the sensor 141 includes a sensor body portion 141a and a laser emitter 141b.

The sensor body portion 141a may emit at least two lasers LA to the outside. Cross section of the laser LA perpendicular to the traveling direction may be a circle a certain diameter or line shape. The sensor body portion 141 may be configured to emit a laser LA of various different diameters or having various different line shapes in cross section. In another embodiment, the sensor body portion 141a may emit only one laser LA having one line shape (or flat shape) in cross section to the outside. Hereinafter, for convenience of description, the case where the sensor body portion 141a emits at least two lasers LA to the outside is mainly described in detail.

The sensor body portion 141a may emit one laser LA, divide the one laser LA into a plurality of lasers LA, and guide the plurality of lasers LA to the laser emitter 141b. In addition, the sensor body portion 141a may sense an amount of the laser LA that is incident to the sensor body portion 141a. For example, the laser LA is emitted from the sensor body portion 141a, reflected from the liquid droplet DR to generate a reflected wave (e.g., a reflected laser), and then the reflected wave is incident to the sensor body portion 141a. In an exemplary embodiment, the sensor body portion 141a includes a laser source, an expander, a beam dividing module (e.g., a beam splitter), and a plurality of laser sensors. The laser source generates the laser LA. The expander expands the laser LA. For example, the expander may increase the diameter of a diameter of a first collimated output beam (i.e., a first laser) to generate a second collimated output beam of a larger diameter (i.e., a second laser). The beam dividing module divides (or splits) the expanded laser LA into a plurality of lasers LA. The plurality of laser sensors are for sensing a reflected laser. In another embodiment, the sensor body portion 141a includes a plurality of laser sources, a plurality of laser guides, and a plurality of laser sensors, the plurality of laser sources each generating one laser LA, the plurality of laser guides guiding each laser source, and the plurality of laser sensors sensing a reflected laser LA. Hereinafter, for convenience of description, the case where the sensor body portion 141a includes the plurality of laser sources, the plurality of laser guides, and the plurality of laser sensors is mainly described in detail.

In an exemplary embodiment, the laser emitter 141b includes a plurality of lenses. In this case, the plurality of lenses may be spaced apart from each other. Each lens may be connected to each laser guide and may guide one laser LA to the outside. One laser LA may be emitted from each lens. In addition, a laser LA or light may be incident to each lens, the laser LA or light being reflected from a liquid droplet DR and then incident again.

In an exemplary embodiment, the sensor 141 includes a chromatic confocal line sensor. In this case, the sensor 141 may be provided as a plurality of sensors and the plurality of sensors may be connected to each other.

The reflector 142 may change a path of the laser LA emitted from the laser emitter 141b. In this case, the reflector 142 may be provided as one or more reflectors to guide the path of the laser LA. In an embodiment where a plurality of reflectors 142 are provided, the reflectors 142 may be arranged to respectively correspond to the lasers LA. In another embodiment where a plurality of reflectors 142 are provided, some reflectors 142 may be arranged at different heights and different locations to correspond to one laser LA. In addition, other reflectors 142 among the plurality of reflectors 142 may be arranged to correspond to another laser LA. Still other reflectors 142 among the plurality of lasers 142 may be arranged to correspond to yet another laser LA. Hereinafter, for convenience of description, the case where the reflector 142 bends or reflects the plurality of lasers LA simultaneously is mainly described in detail. In an exemplary, a reflector 142 is implemented by a mirror.

In an exemplary embodiment, the reflector 142 adjusts the path of the plurality of lasers LA such that the plurality of lasers LA progress over a plane perpendicular to a direction in which the liquid droplet DR discharged from the head unit 130 falls down. In this case, the plurality of lasers LA reflected by the reflector 142 may progress over one plane LAA parallel to a top surface of the stage 110.

In the case where a display device is manufactured by the apparatus 100, the display substrate D is arranged on the stage 110. In an exemplary embodiment, the apparatus 100 for manufacturing the display device includes a chamber 160 in which the stage 110, the movement unit 120, the head unit 130, and the sensor unit 140 are arranged. In this case, the chamber 160 may have a form having an open portion. An open/close structure such as a gate valve may be arranged on the open portion of the chamber 160.

In addition, the apparatus 100 for manufacturing a display device may include a pressure adjustor 170 configured to adjust the pressure of the inside of the chamber 160. In this case, the pressure adjustor 170 may include a pipe 171 and a pressure adjusting pump 172, the pipe 171 being connected to the chamber 160, and the pressure adjusting pump 172 being arranged on the pipe 171. In this case, the pressure of the inside of the chamber 160 may be adjusted according to an operation of the pressure adjusting pump 172. For example, the pressure adjustor 170 may be used to decrease or increase the pressure of the inside of the chamber 160.

In an exemplary embodiment where the display substrate D is arranged on the stage 110, the pressure adjustor 170 makes the pressure of the inside of the chamber 160 less than atmospheric pressure. For example, the pressure adjustor 170 may maintain the pressure of the inside of the chamber 160 close to or similar to a vacuum.

In this case, though not shown, the display substrate D may be moved into the chamber 160 from the outside of the chamber 160 through a robot arm arranged inside or outside the chamber 160.

After the display substrate D is arranged, at least one of the head unit 130 and the movement unit 120 may be moved to arrange the head unit 130 to a location set in advance. Then, a liquid droplet DR is discharged through the nozzle 131. For example, material may be discharged through the nozzle 131 to cause one or more liquid droplets made of the material to fall. The liquid droplet DR may fall down to correspond to an opening area of a pixel-defining layer (not shown) of the display substrate D and form at least one layer of the intermediate layer.

While the above process is performed, the sensor unit 140 may measure a portion of a planar shape of the liquid droplet DR that falls down. Specifically, the sensor 141 may emit the laser LA in a direction parallel to the falling direction of the liquid droplet DR. In addition, the reflector 142 may reflect the plurality of lasers LA to one plane LAA parallel to the top surface of the stage 110. In an exemplary, the one plane LAA is spaced apart from the top surface of the display substrate D.

In the case where the plurality of lasers LA are spaced apart from each other over the one plane LAA parallel to the top surface of the stage 110 as described above, the liquid droplet DR may pass through the one plane LAA over which the lasers LA are arranged. In this case, the laser LA emitted from the sensor 141 may be emitted in synchronization with a discharging frequency of the liquid droplet DR discharged from the nozzle 131 during a discharging period. For example, in the case where a discharging frequency of the liquid droplet DR discharged from the nozzle 131 is about 2 kHz, the sensor 141 may emit the laser LA at about 2 kHz. In an exemplary embodiment, the sensor 141 only emits the laser LA when the liquid droplet DR is discharged from the nozzle 131. Because it takes time until the liquid droplet DR reaches the path of the laser LA after the liquid droplet DR is discharged from the nozzle 131, the laser LA emitted from the sensor 141 may be emitted from the sensor 141 when a predetermined time elapses after the liquid droplet DR is discharged from the head unit 130. For example, emission of the laser LA may be delayed for the predetermined time and then emission of the laser LA may proceed normally.

The laser LA reflected by the reflector 142 may collide with the liquid droplet DR and return to the sensor 141. In this case, the sensor 141 may sense the laser LA that collides with the liquid droplet DR and then is reflected therefrom. For example, the collision of the laser LA with the liquid droplet DR may cause light of the laser LA to reflect back towards the sensor 141, and then the sensor 141 may sense the laser LA has collided with the liquid droplet DR based on the received reflected light (e.g., a sensed result).

Parameters of the liquid droplet DR (e.g., a shape of the liquid droplet DR, a planar center of the liquid droplet DR, the planar center of the liquid droplet DR, etc.) may be determined based on the sensed result. For example, a controller (inside or outside the sensor unit 140) of the apparatus 100 may calculate the parameters. After one or more of the parameters (e.g., the shape of the liquid droplet DR, the planar center of the liquid droplet DR, etc.) are determined, whether to move the movement unit 120, whether to move the head unit 130, whether to operate the head unit 130, whether to change a size of the liquid droplet DR discharged from the head unit 130, whether to change a discharging velocity of the liquid droplet DR, whether to change the angle of discharge of the head unit 130, etc. may be controlled according to the determined parameter(s). In an exemplary embodiment, the controller determines that the movement unit 120 or the head unit 130 needs to be moved from its present position to a new and different position based on one or more of the parameters, the controller provides a control signal to the linear driver 150 instructing the linear driver 150 to move the corresponding unit to the new position, and then the linear driver 150 moves corresponding unit to the new position. In an exemplary embodiment, the controller determines that the discharging velocity needs to be changed from its present velocity to a new and different velocity based on one or more of the parameters, the controller provides a control signal to the head unit 130 instructing the head unit 130 to change the velocity to the new velocity, and then the head unit 130 begins discharging the material at the new velocity. In an exemplary embodiment, the controller determines that the angle of discharge needs to be changed from its present angle to a new and different angle based on one or more of the parameters, the controller provides a control signal to the head unit 130 instructing the head unit 130 to change the angle to the new angle, and then the head unit 130 begins discharging the material at the new angle.

Therefore, the apparatus 100 for manufacturing a display device may accurately discharge the liquid droplet DR. In addition, the apparatus 100 for manufacturing a display device may measure various information of the liquid droplet DR and control output of the liquid droplet DR in real-time using the measured information to accurately discharge the liquid droplet DR.

Hereinafter, a method of sensing a discharged liquid droplet DR is described in detail according to an exemplary embodiment of the inventive concept.

Figure 4:
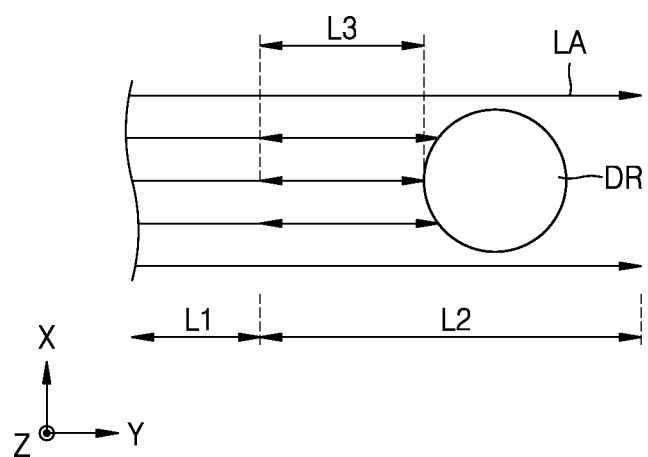
FIG. 4 is a plan view showing that a laser emitted from the laser generator shown in FIG. 2 reaches a liquid droplet.
Figure 5:
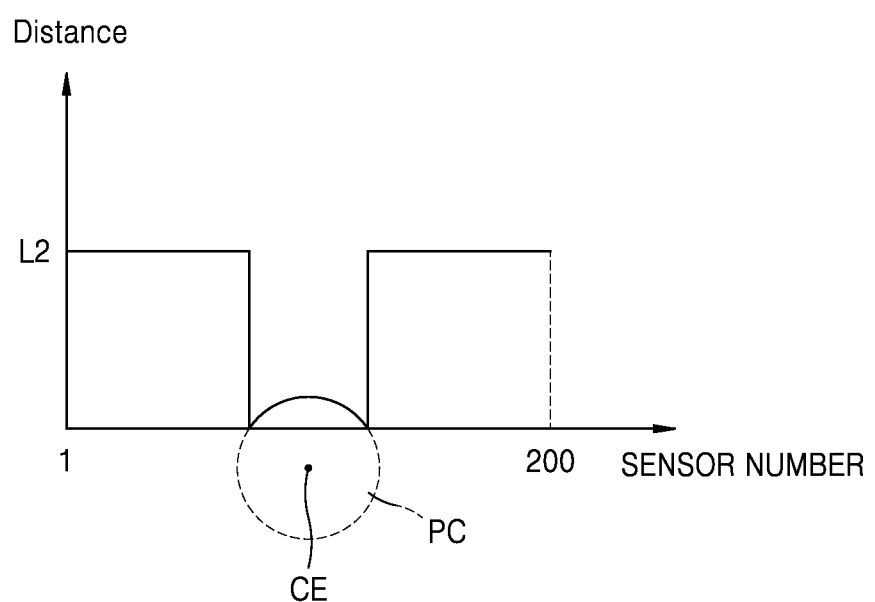
FIG. 5 is a graph showing a signal sensed by the sensor unit shown in FIG. 1.
Figure 6:
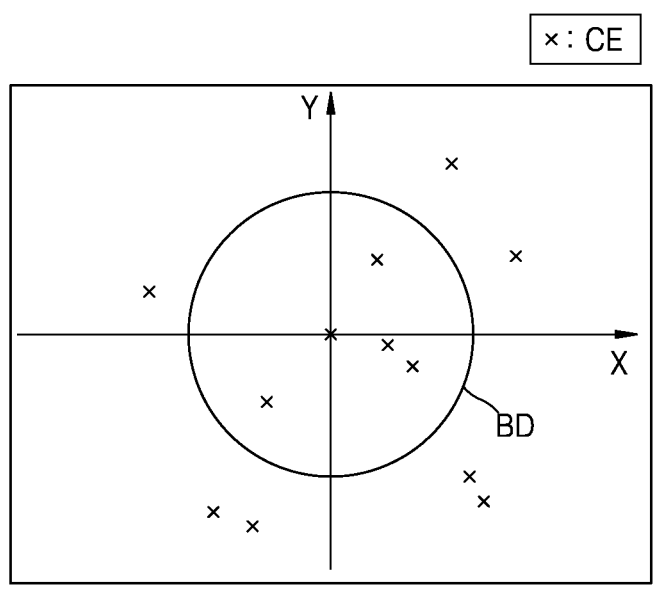
FIG. 6 is a graph showing a center of a liquid droplet calculated according to a signal sensed by the sensor unit shown in FIG. 1.

FIG. 4 is a plan view showing that a laser LA emitted from the laser generator shown in FIG. 2 reaches a liquid droplet DR. FIG. 5 is a graph showing a signal sensed by the sensor unit shown in FIG. 1. FIG. 6 is a graph showing a center of a liquid droplet DR calculated according to a signal sensed by the sensor unit shown in FIG. 1.

Referring to FIGS. 4 to 6, the sensor unit (not shown) emits the laser LA to the outside and measures the intensity of the laser LA that collides with the liquid droplet DR and then is reflected from the liquid droplet DR, and a distance L3 in which the laser LA collides with the liquid droplet DR. In this case, the distance L3 in which the laser LA collides with the liquid droplet DR may include a distance from an end of a working distance L1 to the liquid droplet DR, the working distance L1 including a distance of the laser LA emitted from the sensor (not shown), that cannot be measured. In this case, the working distance L1 may include a distance in which an object passing through the laser LA may be sensed. The laser LA emitted from the sensor may have a measurement distance L2 within a distance apart by a predetermined distance from the working distance L1. For example, the measurement distance L2 may include a distance within about 230 μm from an end of the working distance L1. The distances L1, L2, and L3 may be measured along a same axis as the laser LA.

In an exemplary embodiment, while the liquid droplet DR falls down within the measurement distance L2, the laser LA reaches the liquid droplet DR and then is reflected by the liquid droplet DR and may be incident to the sensor unit again. In an exemplary embodiment, the sensor unit determines that a liquid droplet has fallen when at least two lasers LA reflected by the liquid droplet DR are sensed.

When the at least two reflected lasers LA are sensed as described above, the sensor unit may calculate a size of the liquid droplet DR, a shape of the liquid droplet DR, and a center CE of the liquid droplet DR through the reflected lasers LA. For example, the sensor unit may sense a distance up to the liquid droplet DR through the reflected lasers LA. The sensor unit may determine a portion of a circumference of the liquid droplet DR according to a signal generated from the at least two reflected lasers LA. In an exemplary, a controller (e.g., a control circuit) of the sensor unit calculates a distance from the sensor unit to the liquid droplet DR through each reflected laser LA and then determines that a location spaced apart by the calculated distance from the sensor unit is a point at which each laser LA collides with the liquid droplet DR. In addition, based on the result, the controller may determine a point at which the plurality of lasers LA collide with an outer surface of the liquid droplet DR, calculate a partial circumference of the shape of a planar outer surface of the liquid droplet DR, and calculate a virtual circle PC corresponding to a planar shape of the liquid droplet DR based on the partial circumference. An exemplary signal obtained by sensing the reflected laser LA is shown in FIG. 5.

While the liquid droplet DR falls down, a planar shape thereof may include a circle. In this case, a virtual circle PC calculated based on the result sensed by the sensor unit may be determined as the planar shape of the liquid droplet DR. Based on this, the center CE of the planar shape of the liquid droplet DR and the size of the liquid droplet DR may be calculated.

The above operations may be performed at each head unit 130 and each of the plurality of nozzles 131. Then, the determination (e.g., of the planar shape, the center of the planar shape, or the size of the liquid droplet DR) may be made based on one of the plurality of head units 130. In this case, a location of the head unit 130 serving as a reference may be located on one point of the display substrate D to correspond to a predetermined location.

Based on a location of the liquid droplet DR discharged from the nozzle 131 of the head unit 130 serving as a reference, a location of the liquid droplet DR discharged from one of the plurality of nozzles 131 of each head unit 130 may be calculated. Based on this result, a relative displacement of each of the rest of the plurality of head units 130 may be calculated with respect to the one head unit 130 serving as a reference. For example, a location of the liquid droplet DR discharged from the nozzle 131 of each head unit 130 may be calculated. In this case, a distance between each head unit 130 and the sensor unit may be calculated through a laser LA that collides with an outer surface of the liquid droplet DR discharged from the nozzle 131 of each head unit 130 and is reflected therefrom. In addition, a distance apart from a center CE of a planar shape of the liquid droplet DR discharged from the nozzle 131 of the head unit 130 serving as a reference may be calculated by calculating a center CE of a planar shape of the liquid droplet DR discharged from the nozzle 131 of each head unit 130. In this case, it is possible to determine a location of the rest of the plurality of head units 130 (or heads) corresponding to a location of the head unit 130 serving as a reference. In an exemplary embodiment, a location of the head unit 130 in a first direction (e.g. a Y-axis direction of FIG. 1) is calculated based on a distance between each head unit 130 and the sensor unit. In addition, a distance between an arbitrary straight line which is parallel to a progression direction of a laser LA and which passes through a center CE of a planar shape of the liquid droplet DR discharged from the nozzle 131 of each head unit 130, and an arbitrary straight line which is parallel to a progression direction of a laser LA and which passes through a center CE of a planar shape of the liquid droplet DR discharged from the nozzle 131 of the head unit 130 serving as a reference is calculated. A distance apart in a second direction (e.g. an X-axis direction of FIG. 1) from the head unit 130 serving as a reference may be calculated. In this case, based on the location of the head unit 130 serving as a reference, a relative location of the rest of the plurality of head units 130 may be calculated. A location of each head unit 130 may be calculated by calculating a relative location of a center CE of a planar shape of the liquid droplet DR discharged from the nozzle 131 of another head unit 130 based on a center CE of a planar shape of the liquid droplet DR discharged from the nozzle 131 of the head unit 130 serving as a reference.

Then, based on the location of each head unit 130 calculated through the above process, a location of each head unit 130 may be controlled during a process of discharging the liquid droplet DR to the display substrate D. In an exemplary embodiment, an initial location of each head unit 130 is set such that the nozzle 131 of each head unit 130 corresponds to an opening of a pixel-defining layer (not shown) of the display substrate D. In this case, each head unit 130 may supply the liquid droplet DR to the display substrate D at its predetermined location.

In an exemplary embodiment, after matching at least one nozzle 131 of the head unit 130 serving as a reference to the opening area of the pixel-defining layer of the display substrate D, other head units 130 are controlled to correspond to locations that should be arranged by controlling distances by which the other head units 130 are apart from the head unit 130 serving as a reference.

The above process may be individually performed at each head unit 130. In this case, each nozzle 131 may discharge the liquid droplet DR at an accurate location by finely controlling the location of the head unit 130 according to a relative location of the liquid droplet DR discharged by each nozzle 131. In addition to the above case, the nozzle 131 may be arranged to move in the head unit 130. In this case, the head unit 130 may include a nozzle driver that rotates or linearly moves each nozzle 131. In this case, based on a relative location of the liquid droplet DR discharged from each nozzle 131, a location of each nozzle 131 or a discharging direction of the liquid droplet DR discharged from each nozzle 131 may be controlled.

Based on the above signal, a calculated center CE of a planar shape of the liquid droplet DR may be continuously measured with respect to one head unit 130. This result may be continuously fed back and stored. For example, the sensor unit may include a memory to store the result.

Whether the above result corresponds to a center range BD set in advance may be determined. For example, after each nozzle 131 of one head unit 130 discharges the liquid droplet DR a plurality of number of times, it may be determined how much a center CE of a planar shape of the liquid droplet DR is included in the center range BD set in advance. In an exemplary embodiment, an operation of the head unit 130 is maintained when it is determined that centers CE of planar shapes of more than a predetermined number of liquid droplets DR are arranged in the center range BD. In contrast, when it is determined that centers CE of planar shapes of less than a predetermined number of liquid droplets DR are arranged in the center range BD, an operation of the head unit 130 may be suspended, a location of the head unit 130 may be adjusted (e.g., finely adjusted), a discharging velocity of the liquid droplets DR discharged from the head unit 130 may be adjusted, or a discharged amount of the liquid droplets DR discharged from the head unit 130 may be adjusted.

In the case where the nozzle 131 is arranged on one head unit 130, the above operation may be individually performed at each nozzle 131. In this case, among the plurality of nozzles 131, a nozzle 131 where a problem occurs may be closed to prevent to discharge of the liquid droplets DR from the closed nozzle.

The sensor unit may measure the liquid droplet DR discharged from one nozzle 131 and simultaneously measure the liquid droplets DR discharged from respective nozzles 131. In an exemplary embodiment where the sensor unit simultaneously measures the plurality of liquid droplets DR, some of the plurality of sensor units may be recognized as a group, and the sensor unit of the group may sense one liquid droplet DR.

The sensor unit may sense a location of the display substrate D at which the liquid droplet DR falls down. In this case, the sensor unit may emit the laser LA such that the laser LA is close to an outer surface of the display substrate D. For example, the sensor unit may emit the laser LA to be incident at a location close to the outer surface of the display substrate D. Particularly, the sensor unit may emit the laser LA along a plane spaced apart by a predetermined distance from an outer surface of the display substrate D on which the liquid droplet DR is formed by falling down, and may sense a planar shape and a center of the planar shape of the liquid droplet DR passing through the laser LA.

Based on the sensed result, a point at which the liquid droplet DR falls down on the display substrate D may be calculated based on an arbitrary (or imaginary) line connecting a center of the nozzle 131 of the head unit 130 to a planar center of the liquid droplet DR sensed by the sensor unit, and an arbitrary (or imaginary) line which passes through the center of the nozzle 131 of the head unit 130 and which is perpendicular to the display substrate D. In this case, in an embodiment where a plane through which the laser LA passes is made close to an outer surface of the display substrate D such that a distance between the display substrate D and the plane through which the laser LA passes is very small, it may be determined that a center of the planar shape of the liquid droplet DR sensed by the sensor unit is a point at which the liquid droplet DR falls on the display substrate D.

In another embodiment, the controller calculates a vector (e.g., or an imaginary line) connecting a center of the nozzle 131 to the center of the planar shape of the liquid droplet DR sensed by the sensor unit and determines that a point at which the vector meets the display substrate D is a point at which the liquid droplet DR falls down on the display substrate D.

Therefore, the apparatus (not shown) for manufacturing a display device may monitor parameters of the liquid droplet DR (e.g., planar shape, planar center, etc.) in real-time.

Figure 7:
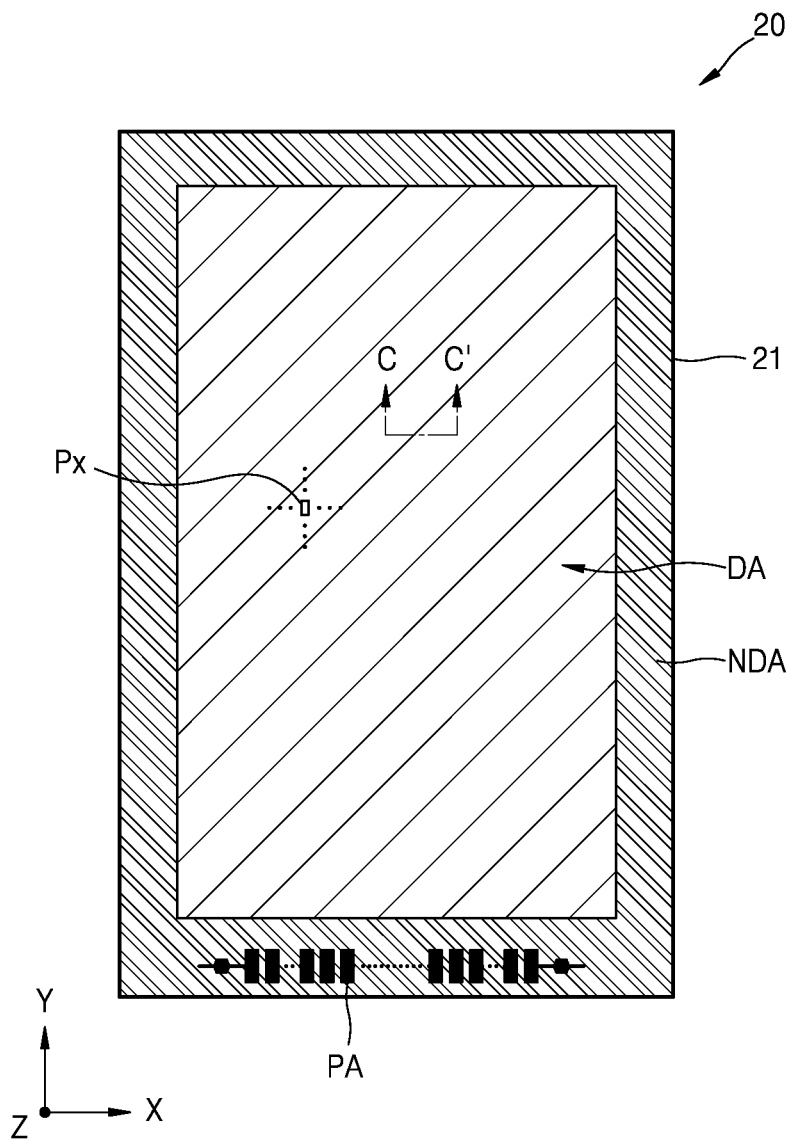
FIG. 7 is a plan view of a display device manufactured according to an exemplary embodiment of the inventive concept.
Figure 8:
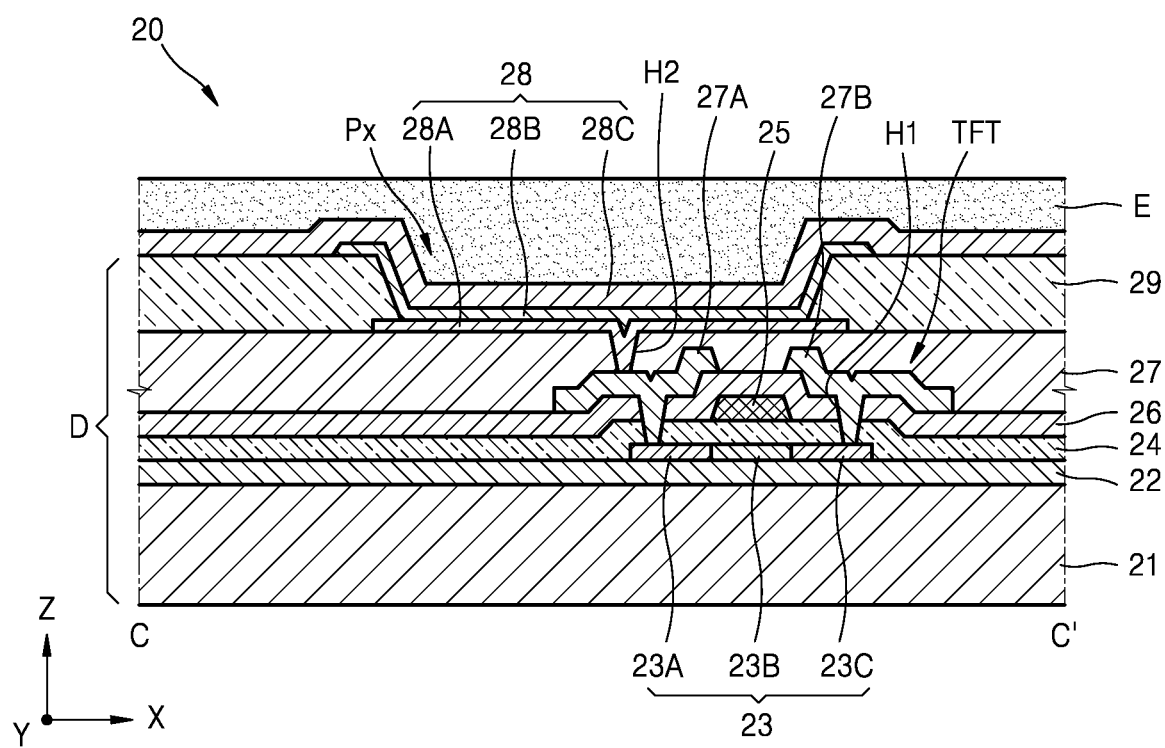
FIG. 8 is a cross-sectional view of the display device taken along line C-C' of FIG. 7.

FIG. 7 is a plan view of a display device 20 manufactured by the apparatus for manufacturing a display device according to an exemplary embodiment of the inventive concept. FIG. 8 is a cross-sectional view of the display device 20 taken along line C-C' of FIG. 7.

Referring to FIGS. 7 and 8, in the display device 20, a display area DA and a non-display area NDA may be defined in a substrate 21, the non-display area NDA being outside the display area DA. For example, a sub-pixel Px may be arranged in the display area DA, and a power line (not shown) may be arranged in the non-display area NDA. In addition, a pad area PA may be arranged in the non-display area NDA.

The display device 20 may include the display substrate D and a sealing member (not shown), the sealing member being arranged on the display substrate D. In this case, the sealing member may include a sealing portion and an encapsulation substrate (not shown), the sealing portion being arranged on the display substrate D, and the encapsulation substrate facing the substrate 21. In another embodiment, the sealing member may include a thin-film encapsulation layer E configured to shield at least a portion of the display substrate D.

As shown in FIG. 8, the display substrate D may include the substrate 21, a thin film transistor TFT, and an organic light-emitting diode 28, the thin film transistor and the organic light-emitting diode 28 being arranged over the substrate 21.

The substrate 21 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, and cellulose acetate propionate. The substrate 21 including the polymer resin may be flexible, rollable, or bendable. The substrate 21 may have a multi-layered structure including a layer including the polymer resin and an inorganic layer (not shown).

The thin film transistor TFT may be formed over the substrate 21. A passivation layer 27 may cover the thin film transistor TFT. The organic light-emitting diode 28 may be formed on the passivation layer 27.

A buffer layer 22 is further formed on a top surface of the substrate 21, the buffer layer 22 including an organic compound and/or an inorganic compound. The buffer layer 22 may include $SiO_x$ (x≥1) or $SiN_x$ (x≥1).

An active layer 23 is formed on the buffer layer 22. The active layer 23 may be arranged in a predetermined pattern. Then, the active layer 23 is buried by a gate insulating layer 24. For example, the gate insulating layer 24 may cover portions of the active layer 23. The active layer 23 includes a source region 23A and a drain region 23C and further includes a channel region 23B therebetween.

The active layer 23 may include various materials. For example, the active layer 23 may include an inorganic semiconductor material such as amorphous silicon or crystalline silicon. In another embodiment, the active layer 23 may include an oxide semiconductor. In another embodiment, the active layer 23 may include an organic semiconductor material. Hereinafter, for convenience of description, the case where the active layer 23 includes amorphous silicon is mainly described in detail.

The active layer 23 may be generated by forming an amorphous silicon layer on the buffer layer 22, crystallizing the amorphous silicon into a polycrystalline silicon layer, and patterning the polycrystalline silicon layer. The source region 23A and the drain region 23C of the active layer 23 may be doped with impurities depending on a type of the thin film transistor TFT such as a driving thin film transistor TFT (not shown) and a switching thin film transistor TFT (not shown).

A gate electrode 25 and an interlayer insulating layer 26 are formed on a top surface of the gate insulating layer 24, the gate electrode 25 corresponding to the active layer 23, and the interlayer insulating layer 26 burying the gate electrode 25. For example, the interlayer insulating layer 26 may cover portions of the gate electrode 25.

In addition, contact holes H1 are formed in the interlayer insulating layer 26 and the gate insulating layer 24. Then, a source electrode 27A and a drain electrode 27B are formed on the interlayer insulating layer 26 to respectively contact the source region 23A and the drain region 23C.

The passivation layer 27 is formed on the thin film transistor TFT. A pixel electrode 28A of the organic light-emitting diode 28 is formed on the passivation layer 27. The pixel electrode 28A contacts the drain electrode 27B of the thin film transistor TFT through a via hole H2 formed in the passivation layer 27. The passivation layer 27 may include a single layer or at least two layers including an inorganic material and/or an organic material. The passivation layer 27 may be formed as a planarization layer having a flat top surface regardless of a layer thereunder having a bent or curved shape. In contrast, the passivation layer 27 may be formed to be bent or curved along the layer thereunder having the bent or curved shape. In an exemplary embodiment, the passivation layer 27 includes a transparent insulator to accomplish a resonance effect.

After the pixel electrode 28A is formed on the passivation layer 27, a pixel-defining layer 29 is formed to cover the pixel electrode 28A and the passivation layer 27. The pixel-defining layer 29 includes an organic material and/or an inorganic material and exposes the pixel electrode 28A.

In addition, an intermediate layer 28B and an opposite electrode 28C are formed on at least the pixel electrode 28A. In another embodiment, the opposite electrode 28C may be formed over an entire surface of the display substrate D. In this case, the opposite electrode 28C may be formed on the intermediate layer 28B and the pixel-defining layer 29. Hereinafter, for convenience of description, the case where the opposite electrode 28C is formed on the intermediate layer 28B and the pixel-defining layer 29 is mainly described in detail.

The pixel electrode 28A serves as an anode electrode, and the opposite electrode 28C serves as a cathode electrode. Polarities of the pixel electrode 28A and the opposite electrode 28C may be reversed.

The pixel electrode 28A is insulated from the opposite electrode 28C by the intermediate layer 28B. When voltages having different polarities are applied to the intermediate layer 28B, light emission is performed in an organic emission layer.

The intermediate layer 28B may include the organic emission layer. In another embodiment, the intermediate layer 28B includes the organic emission layer and may further include at least one of a hole injection layer, a hole transport layer, an electron transport layer, and an electron injection layer. However, embodiments of the present disclosure are not limited thereto, and the intermediate layer 28B may include the organic emission layer and further include various other functional layers (not shown).

The intermediate layer 28B may be provided as a plurality of intermediate layers 28B. The plurality of intermediate layers 28B may constitute the display area DA. In this case, the plurality of intermediate layers 28B may be spaced apart from each other inside the display area DA.

One unit pixel may include a plurality of sub-pixels Px. The plurality of sub-pixels Px may respectively emit pieces of light having various colors. For example, the plurality of sub-pixels Px may include sub-pixels Px respectively emitting red light, green light, and blue light, or include sub-pixels Px respectively emitting red light, green light, blue light, and white light. Each sub-pixel Px may include the pixel electrode 28A, the intermediate layer 28B, and the opposite electrode 28C described above.

The apparatus 100 for manufacturing a display device may form various layers on the display substrate D. For example, the apparatus 100 for manufacturing a display device may form at least one layer of the intermediate layer 28B. For example, the apparatus 100 for manufacturing a display device may form at least one of the organic emission layer, a hole injection layer, a hole transport layer, an electron transport layer, an electron injection layer, and a functional layer.

The thin-film encapsulation layer E may include a plurality of inorganic layers, or include an inorganic layer and an organic layer.

The organic layer of the thin-film encapsulation layer E may include a polymer-based material. The polymer-based material may include polyethylene terephthalate, polyethylene naphthalate, polycarbonate, polyimide, polyethylene sulfonate, polyoxymethylene, polyarylate, hexamethyldisiloxane, an acrylic resin (e.g. polymethylmethacrylate, poly acrylic acid, etc.), or an arbitrary combination thereof.

The inorganic layer of the thin-film encapsulation layer E may include at least one inorganic insulating material among aluminum oxide, titanium oxide, tantalum oxide, hafnium oxide, zinc oxide, silicon oxide, silicon nitride, and silicon oxynitride.

An uppermost layer of the thin-film encapsulation layer E that is exposed to the outside may include an inorganic layer to prevent moisture transmission of the organic light-emitting diode.

The thin-film encapsulation layer E may include at least one sandwich structure in which at least one organic layer is arranged between at least two inorganic layers. In another embodiment, the thin-film encapsulation layer E may include at least one sandwich structure in which at least one inorganic layer is arranged between at least two organic layers. In another embodiment, the thin-film encapsulation layer E may include a sandwich structure in which at least one organic layer is arranged between at least two inorganic layers, and a sandwich structure in which at least one inorganic layer is arranged between at least two organic layers.

The thin-film encapsulation layer E may include, sequentially from above the organic light-emitting diode 28, a first inorganic encapsulation layer, a first organic encapsulation layer, and a second inorganic encapsulation layer.

In another embodiment, the thin-film encapsulation layer E may include, sequentially from above the organic light-emitting diode 28, the first inorganic encapsulation layer, the first organic encapsulation layer, the second inorganic encapsulation layer, a second organic encapsulation layer, and a third inorganic encapsulation layer.

In another embodiment, the thin-film encapsulation layer E may include, sequentially from above the organic light-emitting diode 28, the first inorganic encapsulation layer, the first organic encapsulation layer, the second inorganic encapsulation layer, the second organic encapsulation layer, the third inorganic encapsulation layer, a third organic encapsulation layer, and a fourth inorganic encapsulation layer.

A halogenated metal layer including LiF may be additionally included between the organic light-emitting diode 28 and the first inorganic encapsulation layer. The halogenated metal layer may prevent the organic light-emitting diode 28 from being damaged while the first inorganic encapsulation layer is formed by a sputtering method.

In an exemplary embodiment, the area of the first organic encapsulation layer is less than the area of the second inorganic encapsulation layer. In an exemplary embodiment, the area of the second organic encapsulation layer is less than the area of the third inorganic encapsulation layer.

In the case where the plurality of inorganic layers are provided, the inorganic layers may be deposited to directly contact each other in edge regions of the display device 20, and the organic encapsulation layer is not exposed to the outside.

At least one layer of the intermediate layer 28B and at least one of the organic encapsulation layers of the thin-film encapsulation layer E may be manufactured by the apparatus 100 according an exemplary embodiment of the inventive concept. In this case, because the apparatus for manufacturing a display device according an exemplary embodiment of the inventive concept may supply the liquid droplet DR to the display substrate D in a fine pattern, the display device 20 having a uniform quality may be manufactured. Particularly, in the case where at least one layer of the intermediate layer 28B is formed by the apparatus for manufacturing a display device according to an exemplary embodiment of the inventive concept, because the at least one layer of the intermediate layer 28B is formed in a fine pattern, the display device 20 may display a fine image.

Figure 9:
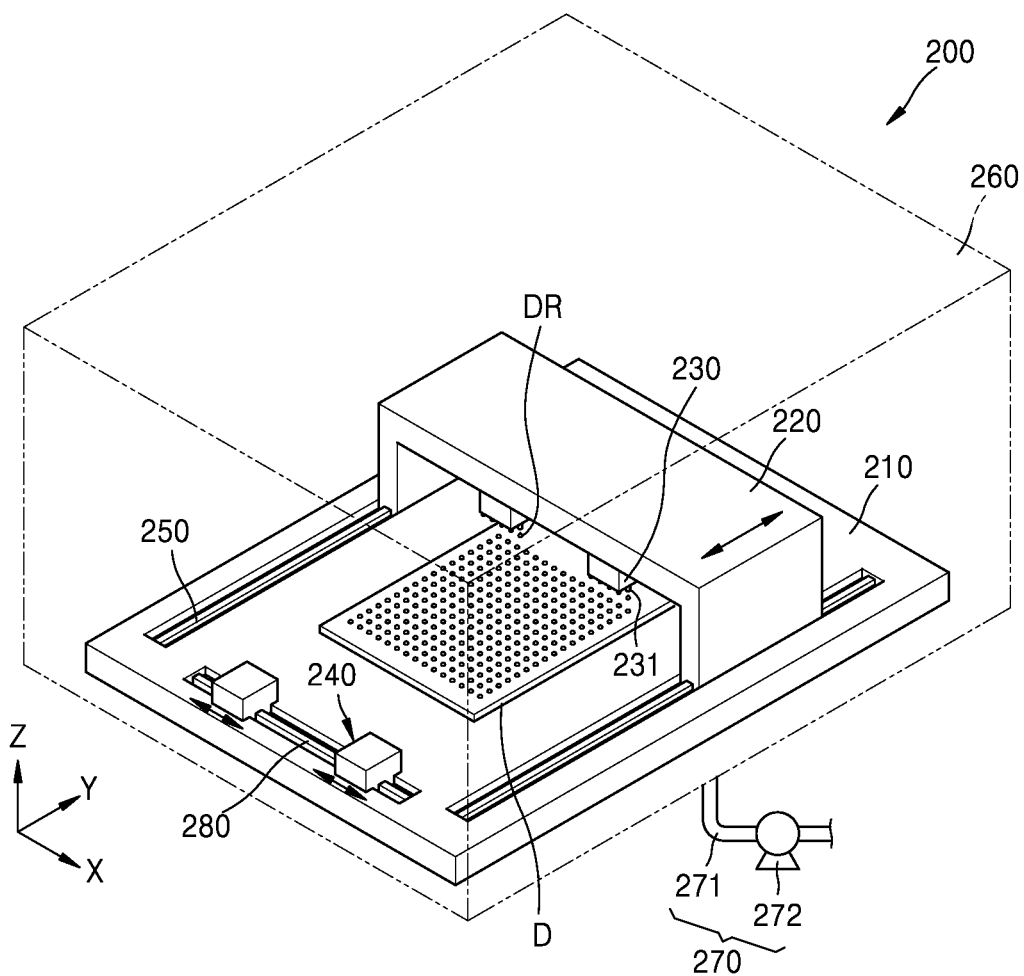
FIG. 9 is a perspective view of an apparatus for manufacturing a display device according to an exemplary embodiment of the inventive concept.
Figure 10:
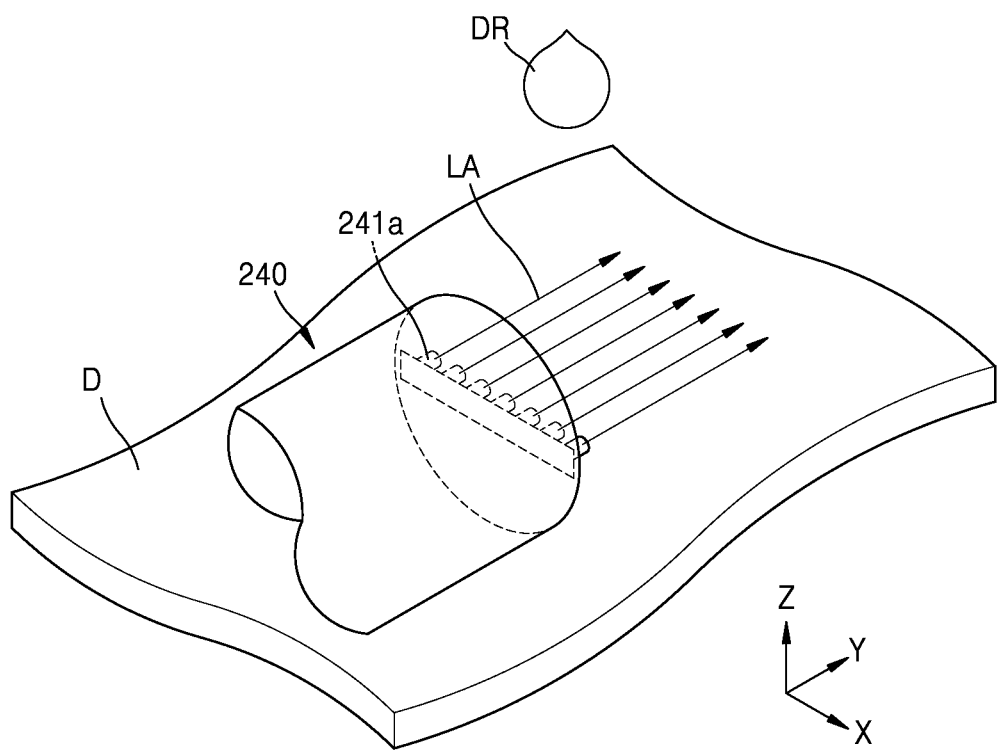
FIG. 10 is a perspective view of a sensor unit and a liquid droplet shown in FIG. 9.

FIG. 9 is a perspective view of an apparatus 200 for manufacturing a display device according to an exemplary embodiment of the inventive concept. FIG. 10 is a perspective view of a sensor unit and a liquid droplet shown in FIG. 9.

Referring to FIGS. 9 and 10, the apparatus 200 for manufacturing a display device includes a stage 210, a movement unit 220, a head unit 230, a sensor unit 240, a linear driver 250, a chamber 260, and a pressure adjustor 270. In this case, because the stage 210, the movement unit 220, the head unit 230, the chamber 260, and the pressure adjustor 270 are the same as or similar to those described with reference to FIGS. 1 to 3, detailed descriptions thereof are omitted.

The sensor unit 240 may be arranged on the chamber 260 or the stage 210. In this case, the sensor unit 240 may be arranged on a top surface of the stage 210. The sensor unit 240 may be fixed to the stage 210. In another embodiment, the sensor unit 240 may be arranged on the stage 210 to move in the same way as the head unit 230 in cooperation with the motion of the head unit 230. In this case, a driver 280 may be arranged on the stage 210, the driver 280 allowing the sensor unit 240 to perform a linear motion. In this case, the driver 280 may be the same as or similar to the linear driver 250. Hereinafter, for convenience of description, the case where the sensor unit 240 is movably arranged on the stage 210 using the driver 280 is mainly described in detail.

In this case, a plurality of lasers LA emitted from the sensor unit 240 may be arranged over a plane parallel to a top surface of the stage 210. That is, the sensor unit 240 may emit the plurality of lasers LA such that the plurality of lasers LA are parallel to the top surface of the stage 210.

In the case where the sensor unit 240 is arranged with respect to the chamber 260, the sensor unit 240 may be arranged to pass through the chamber 260, be arranged to be fixed to the chamber 260, be arranged to be fixed to the outside of the chamber 260, or be arranged to the outside of the chamber 260 such that the sensor unit 240 performs a linear motion. Particularly, in the case where the sensor unit 240 is arranged to pass through the chamber 260, is arranged to be fixed to the chamber 260, or is arranged to be fixed to the outside of the chamber 260, the sensor unit 240 may be arranged in a line and may sense the liquid droplet DR discharged from the head unit 230 within a motion range of the head unit 230. In addition, in the case where the sensor unit 240 is fixed to the chamber 260, fixed to the outside of the chamber 260, or arranged to the outside of the chamber 260 such that the sensor unit 240 performs a linear motion, the chamber 260 may include a transmission window (e.g., a transparent window) to transmit the laser LA emitted from the sensor unit 240. Hereinafter, for convenience of description, the case where the sensor unit 240 is movably arranged on the stage 210 is mainly described in detail. In an exemplary embodiment, the sensor unit 240 moves in a direction that is perpendicular to the direction in which the move unit 220 moves or the head unit 230 moves.

An operation of the apparatus 200 for manufacturing a display device is described below. The pressure of the inside of the chamber 260 is adjusted through the pressure adjustor 270 and then the display substrate D may be seated and fixed on the stage 210.

Then, the head unit 230 may be arranged on a predetermined location by operating the linear driver 250 and a head driver (not shown). The head unit 230 may operate to supply the liquid droplet DR to the display substrate D.

In this case, the sensor unit 240 may emit the laser LA to pass through a path on which the liquid droplet DR falls down. In this case, the laser LA may collide with the liquid droplet DR, be reflected by the liquid droplet DR, and be incident to the sensor unit 240 again. The sensor unit 240 may sense the laser LA that is reflected and is incident.

The planar shape of the liquid droplet DR may be calculated based on the sensed result. The calculation of the result may be performed at the sensor unit 240 or performed at a controller separately provided. For example, the sensor unit 240 may provide the result to an external controller, which could be located inside or outside the chamber 260. The sensor unit 240 may include a sensor body portion 241a that is the same as or similar to the sensor body portion 141a of FIG. 3. For example, the sensor body portion 241a may emit several lasers. The sensor unit 240 may differ from the sensor unit 140 of FIG. 2 by excluding a reflector (e.g., see reflector 142 of FIG. 2).

Based on the calculated result, a diameter, a center, etc. of the planar shape of the liquid droplet DR may be calculated. Then, in the case where the diameter of the planar shape of the liquid droplet DR is different from a predetermined diameter, an amount of the liquid droplet DR discharged from the nozzle 231, a velocity of the liquid droplet DR, etc. may be controlled such that the diameter of the planar shape of the liquid droplet DR becomes the predetermined diameter. In addition, whether a calculated center of the planar shape of the liquid droplet DR is included in a center range (not shown) set in advance is determined. When a predetermined number of centers are arranged outside the center range, an operation of the relevant head unit 230 or an operation of the relevant nozzle 231 may be suspended or adjusted.

Therefore, the apparatus (not shown) for manufacturing a display device, and a method of manufacturing a display device may monitor one or more parameters (e.g., the planar shape, etc.) of the liquid droplet DR in real-time.

Figure 11:
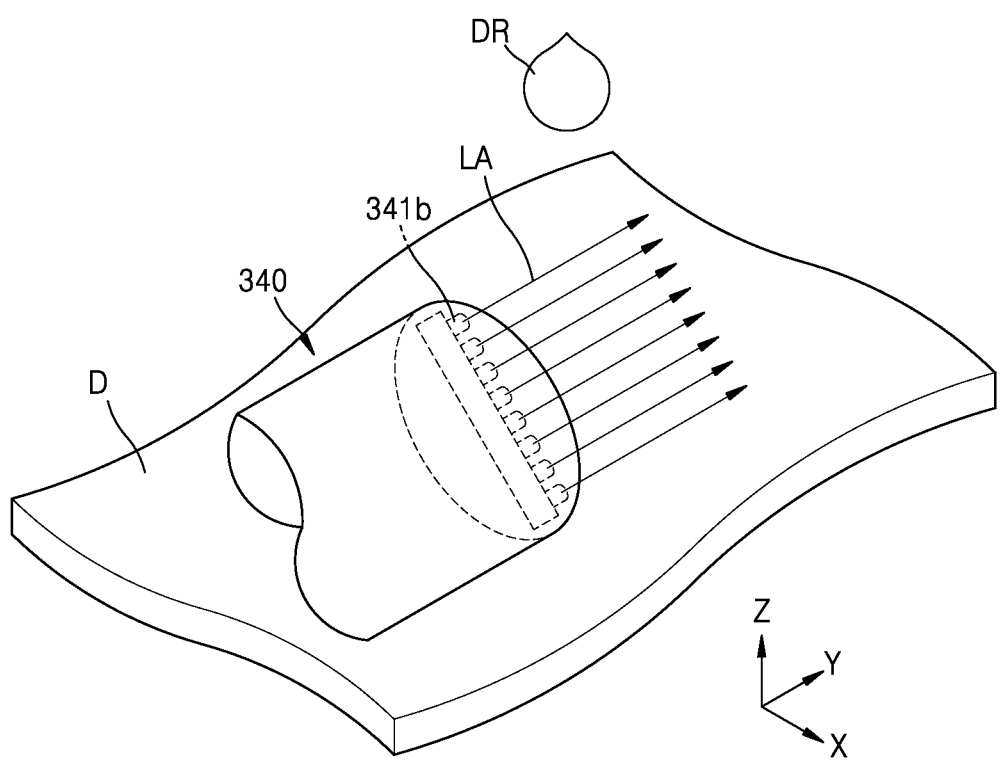
FIG. 11 is a perspective view of a sensor unit of an apparatus for manufacturing a display device according to an exemplary embodiment of the inventive concept.

FIG. 11 is a perspective view of a sensor unit of an apparatus for manufacturing a display device according to an exemplary embodiment of the inventive disclosure.

Referring to FIG. 11, the apparatus (not shown) for manufacturing a display device may include a stage (not shown), a movement unit (not shown), a head unit (not shown), a sensor unit 340, a linear driver (not shown), a chamber (not shown), and a pressure adjuster (not shown). In this case, the stage, the movement unit, the head unit, the sensor unit, the linear driver, the chamber, and the pressure adjustor may be the same as or similar to those described in FIGS. 9 and 10.

Figure 12:
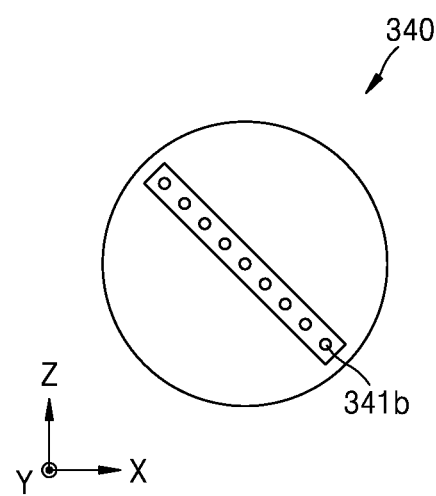
FIG. 12 illustrates a laser emitter of the sensor unit according to an exemplary embodiment of the inventive concept.

In an exemplary embodiment, the sensor unit 340 emits a plurality of lasers LA in an oblique direction or at an oblique angle relative to a surface or plane of the display substrate D. For example, portions of the sensor unit 340 from which the plurality of lasers LA are emitted may be arranged in an oblique direction with respect to an XY plane of FIG. 11. In this case, the plurality of lasers LA may progress on different planes. In an exemplary embodiment as shown in FIG. 12, a laser emitter 341b is arranged in an oblique direction on a ZX plane so that the lasers are emitted in the oblique direction.

In the case where the plurality of lasers LA are arranged on a plane parallel to the stage, respective lasers LA may be spaced apart from each other and thus spaces may be formed. However, in the case where the sensor unit 340 is arranged as described above, when viewed in a plane, an interval between the plurality of lasers LA may be denser than that shown in FIGS. 1 to 3 or FIGS. 9 and 10.

In this case, a method of sensing the liquid droplet DR at the sensor unit 340 may be the same as or similar to that described above. In an embodiment where the plurality of lasers LA are emitted to form a plane inclined with respect to the top surface of the stage, the planar shape of the liquid droplet DR measured by the plurality of lasers LA may always include a portion of a circle. Particularly, as described above, because the plurality of lasers LA are dense on a plane, the outside of the liquid droplet DR may be more accurately measured.

The method of manufacturing a display device (not shown) through the apparatus of FIG. 11 for manufacturing a display device is the same as or similar to that described above.

Therefore, the apparatus (not shown) for manufacturing a display device and the method of manufacturing a display device may monitor parameters of the liquid droplet DR (e.g., planar shape, etc.) in real-time.

An apparatus for manufacturing a display device and a method of manufacturing a display device according to exemplary embodiments of the disclosure may precisely measure the liquid droplet DR forming at least one layer when manufacturing a display device. In addition, an apparatus for manufacturing a display device and a method of manufacturing a display device according to exemplary embodiments of the disclosure may accurately measure whether a nozzle that discharges the liquid droplet DR is out of order. An apparatus for manufacturing a display device and a method of manufacturing a display device according to exemplary embodiments of the disclosure may monitor the planar shape of the liquid droplet DR used when manufacturing a display device in real-time, and repeatedly obtain information for the liquid droplet DR.

While one or more embodiments of the disclosure have been described with reference to the figures, it will be understood by those of ordinary skill in the art that various changes in form and details may be made therein without departing from the spirit and scope of the inventive concept.

What is claimed is:
1. A method of manufacturing a display device, the method comprising:

discharging a material from a head unit to drop a liquid droplet of the material onto a substrate disposed on a stage;

controlling a laser to emit light in a first direction;

using a reflector to change a direction of the emitted light into a second direction different from the first direction along a certain plane to irradiate the liquid droplet while the liquid droplet falls down to the substrate;

measuring a portion of a planar shape of the liquid droplet using light of the laser reflected from the falling irradiated liquid droplet; and adjusting relative locations of the stage and the head unit to adjust relative locations of the substrate and the head unit, based on the measuring portion.

2. The method of claim 1, wherein the controlling of the laser emits at least two lights along the certain plane through which the liquid droplet passes.

3. The method of claim 2, wherein the at least two lights are parallel to each other.

4. The method of claim 1, wherein the certain plane is parallel to a top surface of the substrate to which the liquid droplet falls down.

5. The method of claim 1, wherein the certain plane is inclined with respect to a top surface of the substrate to which the liquid droplet falls down.

6. The method of claim 1, wherein the liquid droplet passes through the emitted light having the second direction at a point that is spaced apart by a predetermined distance from a point from which the light is emitted.

7. The method of claim 1, wherein the liquid droplet includes an organic material.

8. The method of claim 1, further comprising:
calculating a planar size of the liquid droplet from a result of the measuring; and
controlling the head unit to adjust a discharge amount of the liquid droplet based on the planar size of the liquid droplet.

9. The method of claim 1, further comprising:
controlling the head unit based on the measuring portion of the planar shape.

10. A method of manufacturing a display device, the method comprising:
discharging a material from a head unit to drop a liquid droplet of the material onto a substrate;
emitting a laser along a certain plane to irradiate the liquid droplet while the liquid droplet falls down to the substrate;
measuring a portion of a planar shape of the liquid droplet using light of the laser reflected from the falling liquid droplet;
determining a planar location of the measured liquid droplet;
determining whether the discharging is to be stopped based on the planar location of the liquid droplet; and
controlling the head unit to stop the discharging when it is determined that the discharging is to be stopped.

11. A method of manufacturing a display device, the method comprising:
arranging a substrate on a stage;
discharging a liquid droplet from a head unit;
emitting, by a sensor, a laser to irradiate the liquid droplet falling from the head unit onto the substrate;
sensing, by the sensor, light of the laser that is reflected from the liquid droplet;
calculating a portion of a planar shape of the liquid droplet from the reflected light; and
adjusting relative locations of the stage and the head unit to adjust relative locations of the substrate and the head unit, based on the calculated portion.

12. The method of claim 11, further comprising synchronizing an operation frequency of the head unit with an operation frequency of the sensor.

13. The method of claim 11, wherein a path of the laser emitted from the sensor is variable.

14. The method of claim 11, wherein the sensor moves relative to the stage.

15. The method of claim 11, wherein the emitting comprises emitting at least two parallel lasers.

16. The method of claim 15, wherein the at least two parallel lasers form a plane, and the plane formed by the at least two lasers is parallel to a top surface of the substrate or is inclined with respect to the top surface of the substrate.

17. The method of claim 11, further comprising controlling at least one of whether to operate the head unit, a falling speed of the liquid droplet, and an amount of the liquid droplet based on the planar shape of the liquid droplet sensed by the sensor.

* * * * *